United States Patent [19]

Röss et al.

[11] Patent Number: 4,676,814
[45] Date of Patent: Jun. 30, 1987

[54] METHOD FOR THE CONTINUOUS BUILDING OF A HOLLOW CYLINDRICAL SOOT BODY HAVING NO INTERNAL SUPPORT

[75] Inventors: Dieter Röss, Hösbach-Feldkahl; Hans-Ulrich Bonewitz, Hammersbach; Uwe Christiansen, Gelnhausen; Karl-Friedrich Klein, Bruchköbel; Albert Mühlich, Frankfurt; Karlheinz Rau, Hanau; Wolfgang Ruffing, Ottweiler; Fritz Simmat, Gelnhausen; Anton Steinkohl, Gründau; Ralf Takke, Hanau, all of Fed. Rep. of Germany

[73] Assignee: Heraeus Quarzschmelze GmbH, Hanau, Fed. Rep. of Germany

[21] Appl. No.: 866,052

[22] Filed: May 21, 1986

[30] Foreign Application Priority Data

Jun. 15, 1985 [DE] Fed. Rep. of Germany ....... 3521623

[51] Int. Cl.⁴ .................. C03C 25/02; C03B 37/027
[52] U.S. Cl. ........................................ 65/3.12; 65/18.2
[58] Field of Search ................ 65/2, 3.11, 3.12, 18.1, 65/18.3, 18.4

[56] References Cited

U.S. PATENT DOCUMENTS 4,421,539 12/1983 Edahiro et al. ................... 65/3.12

FOREIGN PATENT DOCUMENTS

| 53-19036 | 2/1978 | Japan | 65/3.12 |
| 53-46315 | 4/1978 | Japan | 65/3.12 |
| 53-46316 | 4/1978 | Japan | 65/3.12 |
| 54-7355 | 1/1979 | Japan | 65/18.1 |
| 59-30658 | 7/1984 | Japan | 65/3.12 |

*Primary Examiner*—Robert Lindsay
*Attorney, Agent, or Firm*—Felfe & Lynch

[57] ABSTRACT

Disclosed is a method for the axial building up, in a vertical arrangement, of a hollow cylindrical soot body having no internal support and consisting substantially of silicon dioxide by means of at least one flame hydrolysis build-up burner serving for the soot production. In this method the soot is deposited at the beginning of the build-up onto an auxiliary body, and during the build-up the build-up burner and the growing soot body are rotated relative to one another, and the burner is at the same time held at an unvarying distance from the growing end of the hollow cylinder and centrally above the predetermined cross section of the upwardly growing end of the cylinder wall. The penetration of soot into the interior of the cylinder is prevented by means of a directed gas stream.

13 Claims, 7 Drawing Figures

METHOD FOR THE CONTINUOUS BUILDING OF A HOLLOW CYLINDRICAL SOOT BODY HAVING NO INTERNAL SUPPORT

BACKGROUND OF THE INVENTION

The invention relates to a method for the axial building of a hollow cylindrical soot body having no internal support and consisting substantially of silicon dioxide, in a vertical arrangement, by means of at least one flame hydrolysis build-up burner serving for the production of the soot, the soot being deposited on an auxiliary body at the beginning, and the build-up burner and the growing soot body being rotated relative to one another during the build-up, and the burner being maintained at an unvarying distance from the end of the hollow cylinder on which it is being built up.

A process of this kind is known from European Pat. No. A1-0,041,397 and corresponding U.S. Pat. No. 4,310,339. At the beginning of this process the soot is deposited on a suspended, rotating mandrel by means of burners. The soot body that is built up in this manner is continuously drawn downward axially in the course of the process, while an axial cavity is formed in the soot body due to the mandrel. If necessary, additional burners distributed axially can deposit additional soot layers on the soot body. Below the mandrel, at a slight distance from the latter, there is provided a heating means whereby the preform is consolidated. The consolidated preform is mounted in another turning means and continuously drawn downwardly.

German OS No. 26 47 121 and corresponding U.S. Pat. No. 3,966,446 disclose a process for the building up of a preform for optical fibers, in which the powdered substance is deposited by means of hydrolysis burners on a cylindrical mandrel revolving on a horizontal axis. The burner in this case is moved in several passages along the mandrel until a sufficient layer of soot has built up on the mandrel. In an additional system, the flame of the hydrolysis burner is horizontally aligned and deposits soot on a revolving output mandrel. The mandrel is continuously removed from the flame of the hydrolysis burner with a growing soot body. This process is limited to soot rods having a length of about 6 cm.

The flame hydrolysis technique is generally explained in U.S. Pat. Nos. 2,272,342 and 2,326,059. Reference may also be had to U.S. Pat. No. 3,868,170.

An object of the present invention is to provide a process for the build-up of elongated, hollow cylindrical soot bodies in which assisting or supporting bodies which might negatively affect the inside of the soot cylinder are avoided.

SUMMARY OF THE INVENTION

This and other objects of the invention are achieved in that the mouth of the build-up burner is held approximately centrally above the predetermined cross-section of the upwardly growing free end of the cylinder wall, and that, by means of a directed gas stream, the penetration of soot into the axial cylindrical cavity is prevented. By this process it is possible by the upright growth of the soot cylinder, to produce soot cylinders which have a length of 2000 mm and more, without requiring a supporting body in the cylinder cavity for this purpose. Consequently, there is no need to remove a support body from the cylinder axis or to draw a support body along during the build-up, a technique which has been observed to damage the inside surface of the soot cylinder. Since these damaged layers precisely form the center of the later fiber core, such impairments are especially serious. Instead, according to the present process, the cylinder cavity is determined by the directed gas stream, which prevents the penetration of soot into the axial cylinder cavity.

Depending on the diameter of the hollow cylinder that is to be built up, or on its wall thickness, a plurality of build-up burners are distributed with respect to the cross section of the cylinder wall. For instance, if the outer diameter of the cylinder is 400 mm and the inside diameter is 100 mm the wall thickness will be 150 mm and two build-up burners should be used. The self-supporting soot cylinder that is the product of the process has on its inside cylinder surface an undamaged homogeneous surface layer. Furthermore, the resulting cylinder is low in strains due to the axial build-up of the layers, and the continuous cooling resulting therefrom.

The starting substances for the production of a soot cylinder of this kind are high-purity silicon compounds, e.g., tetrachlorosilane. The starting substances are oxidized with oxygen in a flame, preferably a hydrogen-oxygen gas flame, to the corresponding oxides and deposited on a vertically disposed, rotating auxiliary body at temperatures of 1100° to 1400° C. The auxiliary body serves only initially for the support of the soot material. After the soot body has grown to about 500 to 1000 mm, the auxiliary body can be removed, and the soot body itself can be mounted and rotated by a tool that encompasses its body. Thus, a continuous, progressive build-up of the soot body is possible. Portions of any desired length can be severed from the soot body. In this upright arrangement, soot bodies of great length, i.e., 2 meters and longer, can be built up without a support body.

The auxiliary body consists preferably of vitreous silica, aluminum oxide, or graphite.

What has proven to be especially advantageous is a secondary burner for the production of the gas stream, disposed in the axial cylinder cavity, whereby a gas stream of a particular alignment can be produced, which prevents the penetration of the soot into the axial cylinder cavity. Depending on the speed of rotation and the diameter of the cavity, a plurality of these secondary burners (support burners) can be distributed on the inside wall.

In order to obtain a hollow body of a graded profile, in a preferred embodiment, doped soot is deposited with at least one of the build-up burners. Titanium tetrachloride, germanium tetrachloride, polonium trichloride, aluminum chloride or Frigene (F) is used as the dopant; these have the effect of increasing or lowering the index of refraction in the vitrified hollow body.

The formation of the soot body is affected by a series of factors, especially the position of the deposit surface with respect to the flame of the build-up burner. It has been found advantageous to operate the build-up burners in such an alignment that the axis of their flame cone forms with the plane perpendicular to the cylinder axis an angle of 10° to 50°, preferably of 25° to 30°.

To bring about the build-up of a very smooth surface on the outside of the soot cylinder, an additional secondary burner can be provided, if necessary, on the outside of the soot body, with a flame cone aimed at the growing end. The auxiliary function of the secondary burner or burners is intensified by the fact that the flame cones of the burners are directed at an angle in the build-up direction against the cylinder wall, either toward its inside wall or toward its outside wall.

The secondary burners can be advantageously operated simultaneously as build-up and doping burners.

The auxiliary body on which the soot body is built up in the initial phase is preferably rotated, while the build-up burners are stationary. An auxiliary body that is useful as a means for aiding in the build-up in the initial phase is one which has an annular rim, adapted to the cross section of the hollow cylindrical soot body that is to be built up, on which the soot is deposited.

An auxiliary body that has given good results is one, for example, having an outside diameter of 400 mm, an inside diameter of 100 mm and a height of 150 mm; on it a soot cylinder was built up which had an outside diameter of 400 mm and a diameter in the cylindrical cavity of 100 mm.

The various features of novelty which characterize the invention are pointed out with particularity in the claims annexed to and forming a part of this specification. For a better understanding of the invention, its operating advantages and specific objects obtained by its use, reference should be had to the accompanying drawings and descriptive matter in which there is illustrated and described a preferred embodiment of the invention.

DESCRIPTION OF THE PREFERRED EMBODIMENT

Figure 1:
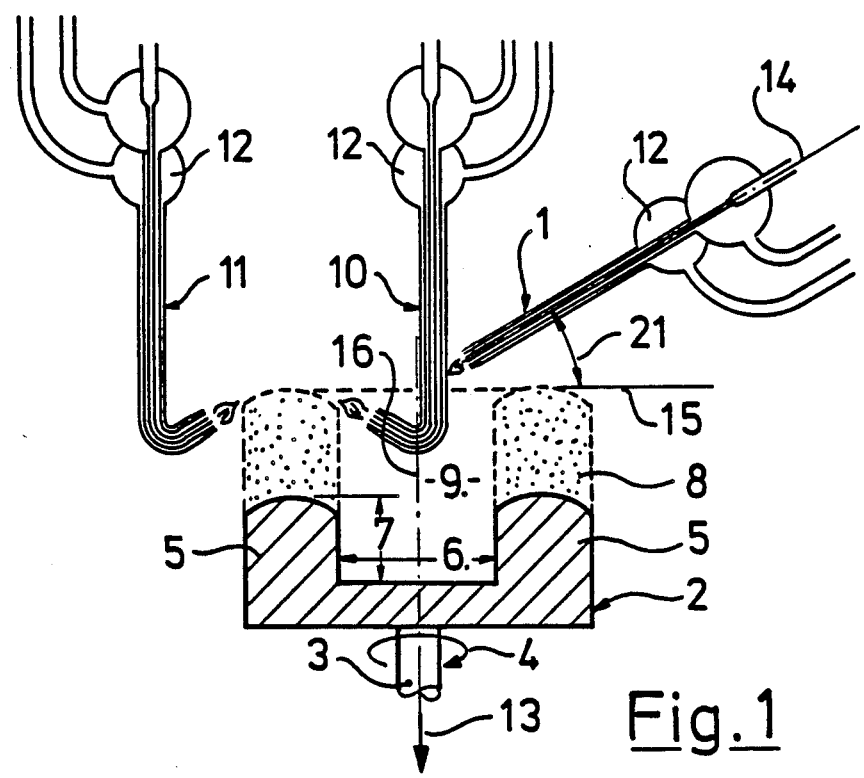
FIG. 1 is a cross section along line I—I of FIG. 2, showing the build-up of a hollow cylindrical soot body during the initial phase.
Figure 2:
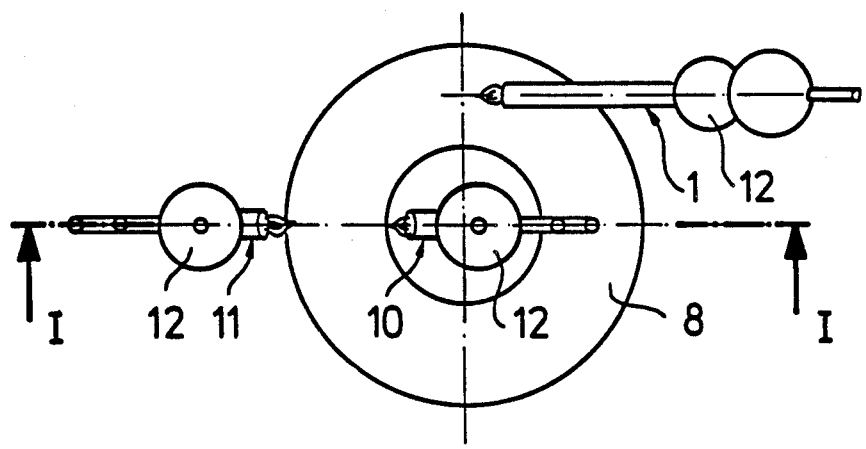
FIG. 2 is a top view of the system according to FIG. 1.

Referring to FIGS. 1 and 2, in the initial phase, the soot is deposited by means of a build-up burner 1 on an auxiliary body 2. While the build-up burner 1 stands still, the auxiliary body 2 is rotated about an axis 3 in the direction of arrow 4. The auxiliary body 2, consisting of vitreous silica, aluminum oxide or graphite, has an annular rim 5 which is adapted to the hollow cylindrical soot body that is to be built up. In this example the outside diameter of the auxiliary body is 400 mm, the inside diameter, indicated by the reference number 6, is about 100 mm, and the height 7 of the rim above the bottom of the inner space is about 150 mm. The top of the rim 5 is slightly rounded; this has an advantageous effect on the build-up of the cylinder, precisely in the initial phase.

During the entire build-up of the cylindrical soot body 8, which grows on the top of the annular rim 5 in an upright arrangement, at least one secondary burner (back-up burner 10) with its burner nozzle directed against the inside wall is operated on the inside of the soot body 8 that is being built up, i.e., on the side forming the cylindrical inner cavity 9, and its gas stream prevents the penetration of soot into the axial cavity of the cylinder. The term, "secondary burner", is not to be interpreted to mean that soot has to be deposited simultaneously with this burner; instead, it is the essential purpose of this burner to produce a directed flow of gas assisting the build-up of the cylinder on its interior. The burner nozzle of the secondary burner 10 is aimed such that the gas flow strikes slightly below the upper edge of the soot body 8 that is just about to build up. This gas flow can be obtained, in addition to the gas flow obtained with the secondary burner, by a gas feed in the bottom part of the auxiliary body 2, which continues along the soot body's cylindrical cavity. In contrast to this kind of gas flow, the gas flow aimed at the upper edge of the soot body, which is achieved by the secondary burner 10, has a substantially greater action. An additional secondary burner 11 is provided, in the embodiment shown, in order to sustain, at the outer circumference of the cylindrical soot body 8, an additional gas stream which corresponds, as regards its function, to the gas stream on the inside of the cylindrical soot body 8 and prevents soot from being deposited beyond the predetermined outside circumference of the soot body.

A fuel supply 12 for the build-up burner 1 and the secondary burners 10 and 11 is indicated diagrammatically.

As it can be seen in the Figures, the flame cone of the secondary burners 10 and 11 is aimed at an angle to the cylinder wall in the soot body build-up direction. While the burners 1, 10 and 11 are operated in a stationary manner the rotating auxiliary body 2 is drawn downward, in the direction of the arrow 13, according to the rate of growth of the soot body. The build-up burner 1, which, as it can be seen in FIG. 2, is disposed approximately centrally over the cross section of the wall of the cylindrical soot body 8, is held such that the axis of its flame cone, indicated by the broken line 14, forms with the plane 15 normal to the cylinder axis 16 an angle 21 of 10° to 50°, preferably in the range from 25° to 30°.

A constant distance between the mouth of the build-up burner and the uppermost portion of the body can be maintained by means of a light-barrier or by laser-light. If the light-pass of the light-barrier or of the laser-light is interrupted by the body which is continuously building up, the whole build-up body can be moved downwardly for a fixed distance or continuously. Other methods are possible.

Figure 3:
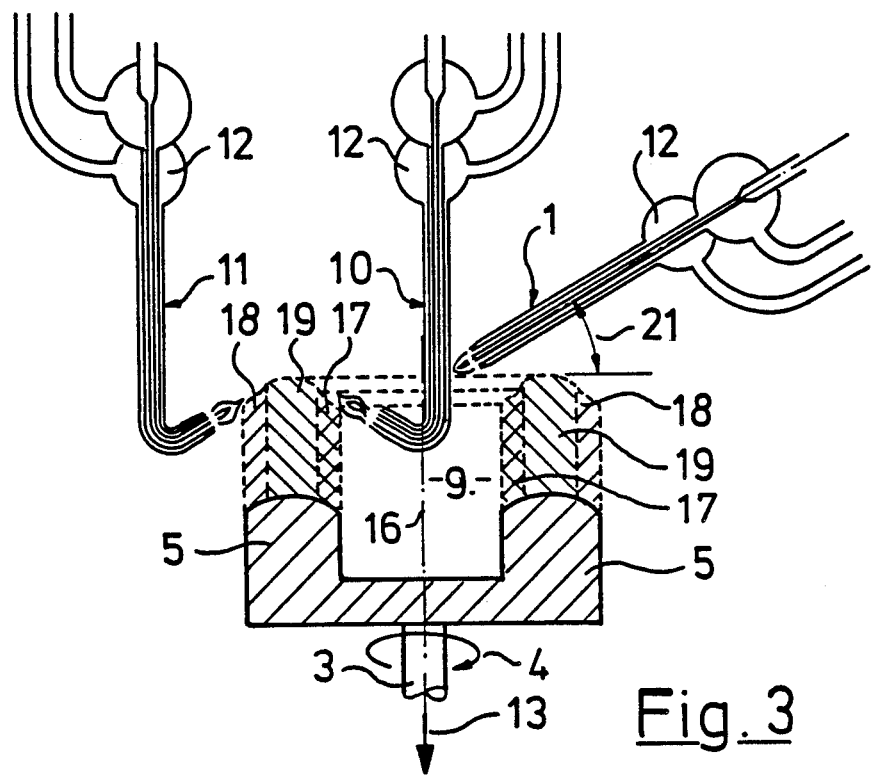
FIG. 3 shows a system similar to that of FIG. 1, in which differently doped soot is deposited with the burners.
Figure 4:
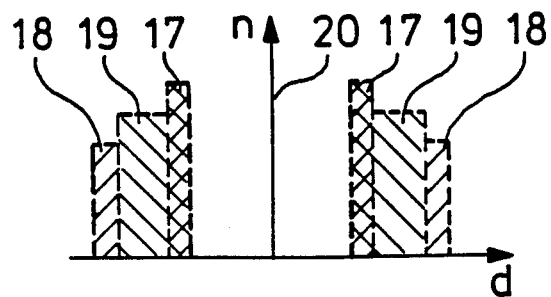
FIG. 4 represents a profile of the index of refraction of a soot cylinder according to FIG. 3.

In comparison with the system represented in FIG. 1, the one represented in FIG. 3 is operated such that a dopant is applied with the two secondary burners 10 and 11 by which the guiding gas stream is produced, so that the cylinder 8 will have, in the area of its inner wall and in the area of its outer wall, differently doped layers 17 and 18, while the core area 19 remains undoped. In this manner, a profile of indices of refraction across the diameter is achieved as represented in FIG. 4 by way of example. Here the inner layer 17 has a higher index of refraction n than the outer layer 18. The center line 20 in this diagram indicates the cylinder axis 16.

Figure 5:
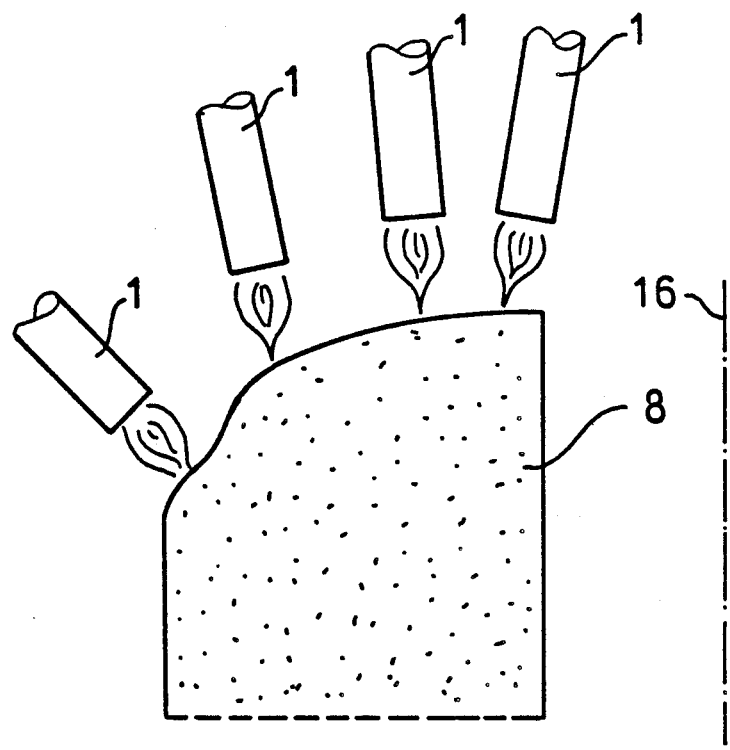
FIG. 5 shows the building up of a soot body especially for a gradient profile fiber.
Figure 6:
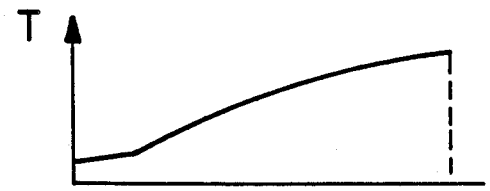
FIGS. 6 and 7 respectively, show the temperature curve associated with the cross section of the soot body according to FIG. 5, as well as its refractive index profile.
Figure 7:
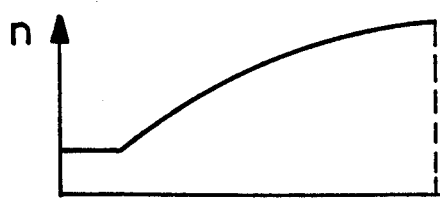

In FIG. 5 is represented a system having a plurality of build-up burners 1 whereby different amounts of dopants are fed in addition to the soot in each case. The temperature distribution of the individual burners 1 is controlled such that the desired amount of dopant is installed by each locally. The temperature distribution over the diameter of the cylinder wall shown in FIG. 5, and the refractive index n that is obtained is represented in FIGS. 6 and 7. The inner burners are operated at a higher temperature T than the outer burners. In this example, the refractive index decreases from the inside out.

As can be seen in FIG. 5, the two outer build-up burners 1 are at an angle to the cylinder axis 16, the outermost build-up burner 1 being at a greater angle to the cylinder axis than the burner further in.

Again in this embodiment, at least one secondary burner 10, (not shown), is operated at the inside wall of the hollow interior of the cylinder, the same as represented in FIGS. 1 and 3, in order to prevent the penetration of soot into the hollow interior of the cylinder.

The terms and expressions which have been employed are used as terms of description and not of limitation, and there is no intention in the use of such terms and expressions of excluding any equivalents of the features shown and described or portions thereof, it being recognized that various modifications are possible within the scope of the invention.

We claim:

1. A method for producing a hollow cylindrical soot body having an axial cavity comprising:
   generating soot by a flame hydrolysis build-up burner, said soot consisting substantially of silicon dioxide;
   depositing said soot on an auxiliary body to build up said soot body in a vertical arrangement without a support internal to said soot body and form a build-up end of said soot body, said build-up end having a predetermined cross section;
   rotating said auxiliary body relative to said flame hydrolysis build-up burner;
   maintaining said build-up burner at a substantially constant distance from said build-up end and centrally with respect to the cross section of said build-up end; and
   preventing penetration of soot into said axial cavity by a directed gas stream.

2. The method of claim 1, wherein the gas stream preventing the penetration of soot into the axial cylinder cavity is obtained with a secondary burner which is disposed in the cylinder cavity.

3. The method of claim 1, wherein the cylinder build-up is performed with a plurality of build-up burners, said build-up burners disposed and distributed over the cylinder wall cross section.

4. The method of claim 3, wherein doped soot is deposited with at least one of the build-up burners.

5. The method of claim 1, wherein at least one build-up burner is held such that the axis of its flame cone encloses with the plane perpendicular to the cylinder axis an angle of 10° to 50°.

6. The method of claim 5, wherein the build-up burner is held at an angle of 25° to 30°.

7. The method of claim 1, wherein a gas stream is maintained at the outer circumference of the soot body.

8. The method of claim 7, wherein a gas stream at the outer circumference of the cylinder is produced with an additional secondary burner.

9. The method of claim 1, wherein the flame cone of each secondary burner is aimed at an angle in the build-up direction against the cylinder wall.

10. The method of claim 1, wherein the secondary burner is operated as a build-up or doping burner.

11. The method of claim 1, wherein the auxiliary body is rotated.

12. The method of claim 1, wherein the auxiliary body has an annular rim adapted to the cross section of the hollow cylinder that is to be built up, on which rim the soot is deposited.

13. A method for producing a hollow cylindrical soot body having an axial cavity and a cylindrical length of at least 2000 mm comprising:
   generating soot by a flame hydrolysis build-up burner, said soot consisting substantially of silicon dioxide;
   depositing said soot on an auxiliary body to build up said soot body in a vertical arrangement without a support internal to said soot body and form a build-up end of said soot body, said build-up end having a predetermined cross section;
   rotating said auxiliary body relative to said flame hydrolysis build-up burner;
   maintaining said build-up burner at a substantially constant distance from said build-up end and centrally with respect to the cross section of said build-up end; and
   preventing penetration of soot into said axial cavity by a directed gas stream.

* * * * *